United States Patent
Jang et al.

(10) Patent No.: US 9,256,103 B2
(45) Date of Patent: Feb. 9, 2016

(54) LIQUID CRYSTAL DISPLAY INCLUDING LIQUID CRYSTAL WITH DIFFERENT PRETILT ANGLES AND METHOD OF MANUFACTURING THE SAME

(71) Applicant: Samsung Display Co., Ltd., Yongin, Gyeonggi-Do (KR)

(72) Inventors: Jae-Soo Jang, Suwon-si (KR); Haksun Chang, Yongin-si (KR); Jang Wi Ryu, Seoul (KR); Kichul Shin, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 196 days.

(21) Appl. No.: 13/772,590

(22) Filed: Feb. 21, 2013

(65) Prior Publication Data
US 2014/0098313 A1   Apr. 10, 2014

(30) Foreign Application Priority Data
Oct. 8, 2012 (KR) .................. 10-2012-0111274

(51) Int. Cl.
*G02F 1/1337* (2006.01)
*H01L 33/00* (2010.01)
(Continued)

(52) U.S. Cl.
CPC ............ *G02F 1/1337* (2013.01); *G02F 1/1395* (2013.01); *G02F 1/133753* (2013.01); *H01L 33/0041* (2013.01);
(Continued)

(58) Field of Classification Search
CPC .............. G02F 1/1337; G02F 2001/133773; G02F 1/1395; G02F 2001/133357; G09G 2300/0491

USPC .......................................... 349/128
See application file for complete search history.

(56) References Cited

U.S. PATENT DOCUMENTS 5,058,998 A * 10/1991 Yoshida et al. ............. 349/101
5,638,201 A   6/1997 Bos et al.
(Continued)

FOREIGN PATENT DOCUMENTS

JP   08-286189 A   11/1996
JP   08-328045 A   12/1996
(Continued)

OTHER PUBLICATIONS

Eun Jeong Jeon et al., "Electro-optic characteristics as a function of pretilt angle in the optically compensated splay liquid crystal cell", Current Applied Physics, 2010, vol. 10, pp. 245-248.

*Primary Examiner* — Paisley L Arendt
(74) *Attorney, Agent, or Firm* — Cantor Colburn LLP

(57) ABSTRACT

A liquid crystal display includes first and second substrates, first and second alignment layers, and a liquid crystal layer between the alignment layers and including liquid crystal molecules. The liquid crystal molecules on a surface of the first alignment layer have a first pretilt angle in a direction which is vertical with respect to a horizontal plane surface parallel to the first substrate, and a first alignment angle in a direction which is horizontal with respect to a horizontal line parallel to the horizontal plane surface. The liquid crystal molecules on a surface of the second alignment layer have a second pretilt angle in the direction which is vertical with respect to the horizontal plane surface and different from the first pretilt angle, and a second alignment angle in the direction which is horizontal with respect to the horizontal line and different from the first alignment angle.

15 Claims, 12 Drawing Sheets

(51) Int. Cl.
  *G02F 1/139* (2006.01)
  *G02F 1/1333* (2006.01)
(52) U.S. Cl.
  CPC .............. *G02F 2001/133357* (2013.01); *G02F 2001/133761* (2013.01); *G02F 2001/133773* (2013.01); *G09G 2300/0491* (2013.01)

(56) References Cited

U.S. PATENT DOCUMENTS

| | | | |
|---|---|---|---|
| 5,682,217 | A | 10/1997 | Hisatake et al. |
| 6,061,116 | A * | 5/2000 | Nishida et al. ................ 349/130 |
| 6,469,762 | B1 | 10/2002 | Hong et al. |
| 6,512,569 | B1 | 1/2003 | Acosta et al. |
| 7,142,259 | B2 | 11/2006 | Hattori et al. |
| 7,557,884 | B2 | 7/2009 | Kwok et al. |
| 7,956,980 | B2 | 6/2011 | Jones |
| 2006/0125986 | A1 * | 6/2006 | Choo et al. .................... 349/114 |

FOREIGN PATENT DOCUMENTS

| | | |
|---|---|---|
| JP | 2007-199191 A | 8/2007 |
| JP | 2007-225962 A | 9/2007 |
| JP | 2009-229894 A | 10/2009 |
| KR | 1020000058905 A | 10/2000 |
| KR | 10-0659487 B1 | 12/2006 |
| KR | 10-0683136 B1 | 2/2007 |
| KR | 1020080026827 A | 3/2008 |

* cited by examiner

LIQUID CRYSTAL DISPLAY INCLUDING LIQUID CRYSTAL WITH DIFFERENT PRETILT ANGLES AND METHOD OF MANUFACTURING THE SAME

This application claims priority to Korean Patent Application No. 10-2012-0111274, filed on Oct. 8, 2012, and all the benefits accruing therefrom under 35 U.S.C. §119, the contents of which are hereby incorporated by reference.

BACKGROUND

1. Field

The invention relates to a liquid crystal display and a method of manufacturing the same. More particularly, the invention relates to a liquid crystal display having improved response speed and a method of manufacturing the liquid crystal display.

2. Description of the Related Art

In general, a liquid crystal display includes a lower substrate on which a thin film transistor is disposed, an upper substrate on which a color filter is disposed, and a liquid crystal layer having an anisotropic dielectric constant between the lower and upper substrates. The liquid crystal display applies an electric field to the liquid crystal layer to control an arrangement of liquid crystal molecules of the liquid crystal layer, and thereby controls a transmittance of light passing through the liquid crystal layer to display an image thereon.

The liquid crystal molecules of the liquid crystal layer are aligned in an optically compensated bended ("OCB") mode or an optically compensated splay ("OCS") mode. In the OCS mode, the liquid crystal molecules are arranged in a bended state before an initial electric field is applied thereto, and then the arrangement of the liquid crystal molecules is changed to a first splay state when the initial electric field is applied. Then, when an electric field which is relatively larger than the initial electric field is applied to the liquid crystal molecules, the liquid crystal molecules are arranged in a second splay state in which the liquid crystal molecules are more parallel to a substrate of the liquid crystal display than in the first splay state.

However, since the initial electric field is applied in the OCS mode to maintain the arrangement in the first splay state of the liquid crystal molecules, and since a difference between the arrangement of the liquid crystal molecules in the first splay state and the arrangement of the liquid crystal molecules in the second splay state is relatively small, the gray-scale expression is extremely restricted. In addition, when no initial electric field is applied to the liquid crystal molecules, it may take an undesirably large amount of time such as one minute or more to switch the arrangement of the liquid crystal molecules from the bended state to the second splay state. Therefore, there remains a need for an improved liquid crystal display which reduces a time period for switching the arrangement of the liquid crystal molecules from an initial bended state to a splay state.

SUMMARY

One or more embodiment of the invention provides a liquid crystal display capable of reducing a time period required to switch an arrangement of liquid crystal molecules from a bended state to a splay state.

One or more embodiment of the invention provides a liquid crystal display capable of improving a response speed of the liquid crystal molecules without an initial electric field applied thereto.

The invention provides a method of manufacturing the liquid crystal display.

Exemplary embodiments of the invention provide a liquid crystal display including a first substrate, a second substrate, a first alignment layer, a second alignment layer and a liquid crystal layer.

The first substrate includes a thin film transistor and the second substrate includes a color filter and faces the first substrate.

The first alignment layer is disposed on the first substrate, and the second alignment layer is disposed on the second substrate to face the first alignment layer.

The liquid crystal layer is disposed between the first alignment layer and the second alignment layer, and includes liquid crystal molecules arranged in accordance with an electric field.

The liquid crystal molecules on a surface of the first alignment layer have a first pretilt angle in a direction which is vertical with respect to a horizontal plane surface parallel to the first substrate, and a first alignment angle in a direction which is horizontal with respect to a horizontal line parallel to the horizontal plane.

The liquid crystal molecules on a surface of the second alignment layer have a second pretilt angle in the direction which is vertical with respect to the horizontal plane surface, and different from the first pretilt angle, and a second alignment angle in the direction which is horizontal with respect to the horizontal line, and different from the first alignment angle.

A difference between the first pretilt angle and the second pretilt angle is in a range equal to or greater than about two degrees and equal to or smaller than about three degrees.

A difference between the first alignment angle and the second alignment angle is in a range equal to or greater than about zero degrees and equal to or smaller than about five degrees.

Exemplary embodiments of the invention provide a method of manufacturing a liquid crystal display including preparing a first substrate including a thin film transistor, preparing a second substrate including a color filter, providing a first alignment layer on the first substrate, providing a second alignment layer on the second substrate, and providing a liquid crystal layer between the first substrate and the second substrate. The liquid crystal layer includes liquid crystal molecules. The liquid crystal molecules on a surface of the first alignment layer have a first pretilt angle in a direction which is vertical with respect to a horizontal plane surface parallel to the first substrate, and a first alignment angle in a direction which is horizontal with respect to a horizontal line parallel to the horizontal plane surface. The liquid crystal molecules on a surface of the second alignment layer have a second pretilt angle in the direction which is vertical with respect to the horizontal plane surface, and different from the first pretilt angle, and a second alignment angle in the direction which is horizontal with respect to the horizontal line, and different from the first alignment angle.

A difference between the first pretilt angle and the second pretilt angle is in a range equal to or greater than about two degrees and equal to or smaller than about three degrees, and a difference between the first alignment angle and the second alignment angle is in a range equal to or greater than about zero degrees and equal to or smaller than about five degrees.

Each of the providing a first alignment layer and the providing a second alignment layer includes a rubbing process or an optical alignment process.

According to one or more exemplary embodiments of the invention, the time required until the arrangement of the liquid crystal molecules is changed to the splay state from the bended state may be reduced.

In addition, the response speed of the liquid crystal molecules may be improved without forming the initial electric field.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
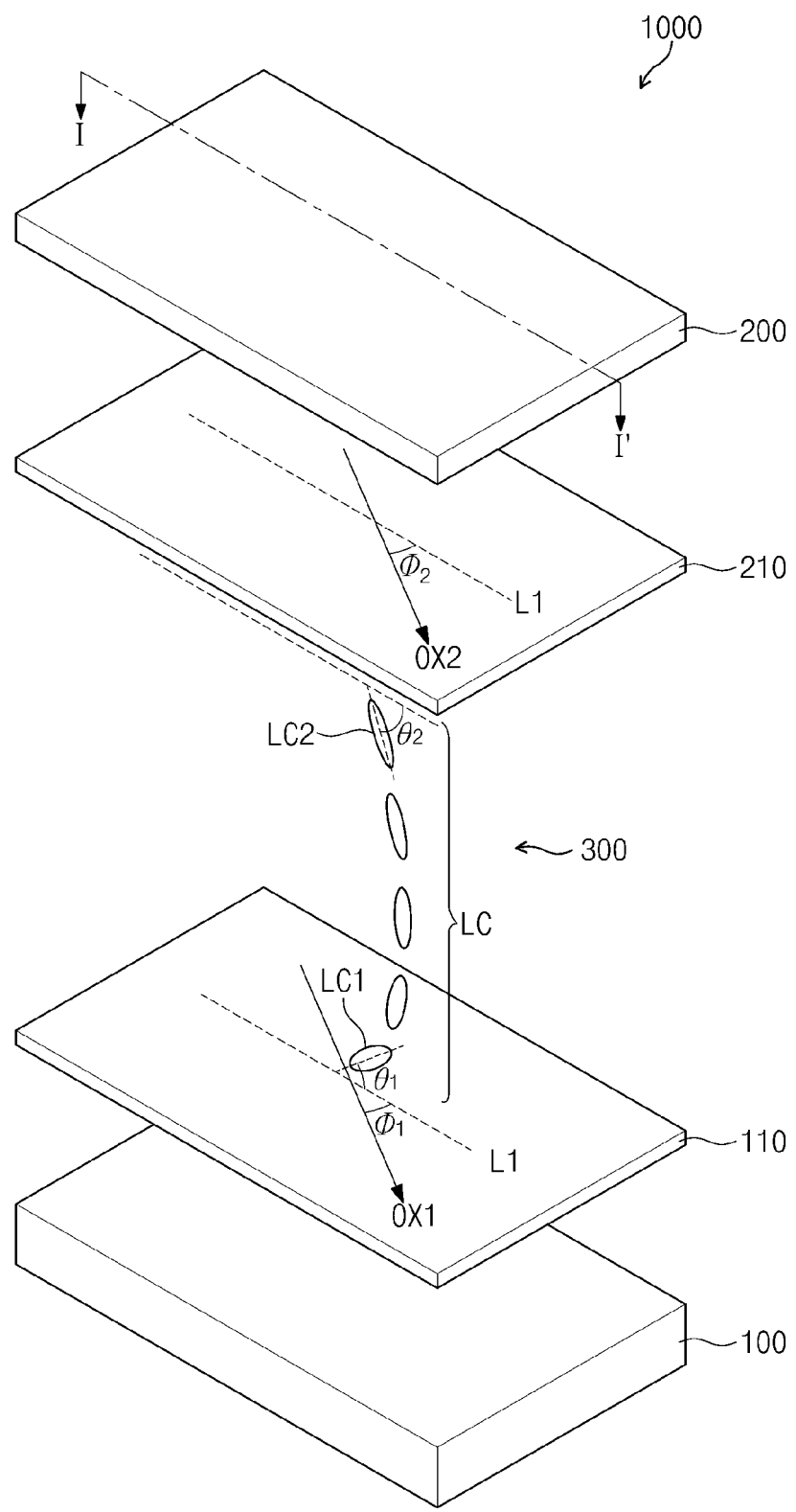
FIG. 1 is an exploded perspective view showing an exemplary embodiment of a liquid crystal display according to the invention.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" other elements or features would then be oriented "upper" the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

Figure 2:
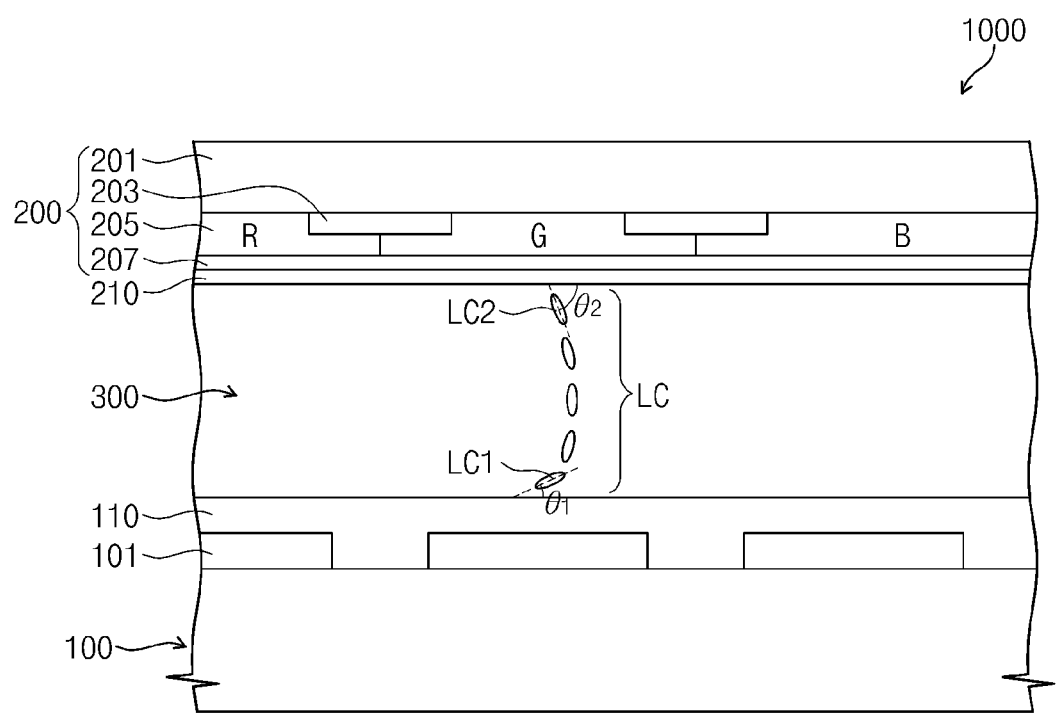
FIG. 2 is a cross-sectional view taken along line I-I' of FIG. 1.

FIG. 1 is an exploded perspective view showing an exemplary embodiment of a liquid crystal display 1000 according to the invention and FIG. 2 is a cross-sectional view taken along line I-I' of FIG. 1.

Referring to FIGS. 1 and 2, the liquid crystal display 1000 includes a first substrate 100, a second substrate 200, a first alignment layer 110, a second alignment layer 210 and a liquid crystal layer 300.

The first substrate 100 may be an array substrate including one or more thin film transistor. Although not shown in figures, the first substrate 100 includes a first insulating substrate (not shown) including an insulating material, and the thin film transistor (not shown), one or more gate line (not shown) and one or more data line (not shown).

In addition, the first substrate 100 further includes one or more pixel electrode 101 connected to an output terminal of the thin film transistor. The pixel electrode 101 receives a data voltage from the thin film transistor. The pixel electrode 101 may include a transparent material, e.g., indium tin oxide ("ITO"), indium zinc oxide ("IZO"), indium zinc tin oxide ("IZTO"), etc.

The first substrate 100 includes one or more pixel area (not shown). In one exemplary embodiment, a plurality of pixel areas may be defined in association with a plurality of gate lines and a plurality of data lines, but the invention is not limited thereto or thereby. The pixel electrode 101 is disposed in the pixel area, or in each pixel area among a plurality of pixel areas.

The second substrate 200 includes a second insulating substrate 201 including an insulating material, a black matrix 203, a color filter 205 and a common electrode 207.

The black matrix 203 is disposed on the second insulating substrate 201 to prevent a light leakage. The black matrix 203 covers (e.g., overlaps) the gate lines, the data lines and the thin film transistor in a plan view of the liquid crystal display 1000.

The color filter 205 is disposed on the second insulating substrate 201 and on the black matrix 203. The color filter 205 allows the light passing through the liquid crystal layer 300 to have a color. A collective color filter member may include a plurality of color filter 205. The plurality of color filters 205 may include red, green and blue color filters R, G and B, respectively. The red, green and blue color filters 205 R, G, and B may have a stripe shape in the plan view and correspond to the pixel areas, respectively.

The common electrode 207 is disposed on the color filter 205 and receives a common voltage. The common electrode 207 may include a transparent material, such as ITO, IZO, ITZO, etc.

The liquid crystal layer 300 is disposed between the first substrate 100 and the second substrate 200. The liquid crystal layer 300 includes a plurality of liquid crystal molecules LC. The liquid crystal molecules LC are arranged in accordance with an electric field applied thereto. The electric field is generated by a voltage difference between the data voltage applied to the pixel electrode 101 and the common voltage applied to the common electrode 207 to control a transmittance of the light passing through the liquid crystal layer 300. To this end, the liquid crystal molecules LC have an anisotropic dielectric constant and an anisotropic refractive index.

Hereinafter, for the convenience of explanation, the liquid crystal molecules disposed on and/or near a surface of the first alignment layer 110 are referred to as first liquid crystal molecules LC1, and the liquid crystal molecules disposed on and/or near a surface of the second alignment layer 210 are referred to as second liquid crystal molecules LC2.

The first alignment layer 110 is disposed on the pixel electrode 101. The first alignment layer 110 has a first alignment axis OX1. The first alignment axis OX1 forms a first alignment angle $\Phi 1$ in a direction horizontal (e.g., parallel) with respect to a horizontal line L1 in a horizontal plane surface parallel to the first substrate 100. The horizontal line L1 may otherwise be referred to as a reference line. A direction of a long axis of the first liquid crystal molecules LC1 in the plane parallel to that of the first substrate is determined along the first alignment axis OX1.

In addition, the first alignment layer 110 controls a pretilt angle of the first liquid crystal molecules LC1. The first liquid crystal molecules LC1 have a first pretilt angle $\theta 1$ that is an acute angle in a direction vertical (or perpendicular) to the horizontal plane surface which is parallel to that of the first substrate 100, by the first alignment layer 110.

The second alignment layer 210 faces the first alignment layer 110 and is disposed on the common electrode 207. The second alignment layer 210 has a second alignment axis OX2 different from the first alignment axis OX1. The second alignment axis OX2 forms a second alignment angle $\Phi 2$ in a direction horizontal with respect to the horizontal line L1 in the horizontal plane surface parallel to the first substrate 100. A direction of a long axis of the second liquid crystal molecules LC2 in the plane parallel to that of the first substrate 100 is determined along the second alignment axis OX2.

In addition, the second alignment layer 210 controls a pretilt angle of the second liquid crystal molecules LC2. The second liquid crystal molecules LC2 have a second pretilt angle $\theta 2$ that is an acute angle in a the plane vertical to the horizontal plane surface which is parallel to that of the second substrate 200, by the second alignment layer 210.

A difference between the first pretilt angle $\theta 1$ and the second pretilt angle $\theta 2$ is in a range equal to or greater than about two degrees and equal to or smaller than three degrees. In one exemplary embodiment, for example, when the first pretilt angle $\theta 1$ is about 87 degrees, the second pretilt angle $\theta 2$ is in a range from about 84 degrees to about 85 degrees.

The pretilt angle of the liquid crystal molecules LC approaches about 90 degrees as the liquid crystal molecules LC are closer to a center portion of the liquid crystal layer 300, that is, in a direction away from the first and second alignment layers 110 and 210.

Figure 3:
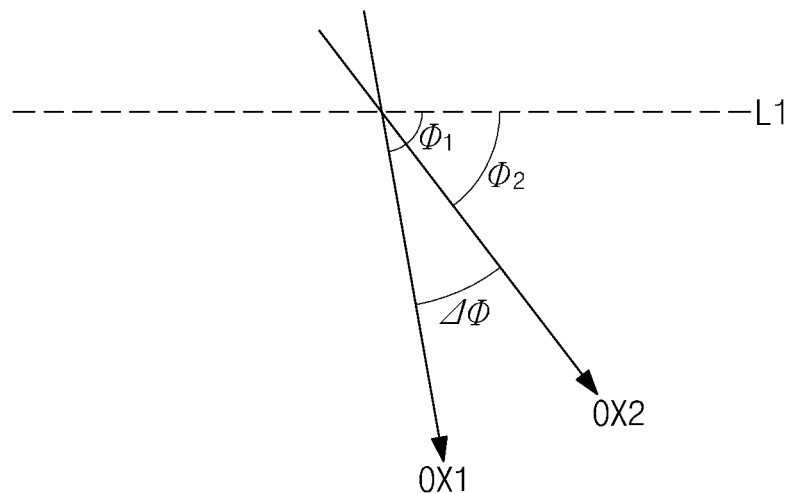
FIG. 3 is a view showing an exemplary embodiment of a first alignment axis and a second alignment axis when viewed in a direction vertical to a first substrate of the liquid crystal display.

FIG. 3 is a view showing an exemplary embodiment of the first alignment axis OX1 and the second alignment axis OX2 when viewed in a direction vertical to the first substrate 100.

Referring to FIGS. 1 and 3, a difference $\Delta\Phi$ between the first alignment angle $\Phi 1$ and the second alignment angle $\Phi 2$ is greater than zero degree and equal to or smaller than about five degrees.

The liquid crystal molecules LC have the alignment angle between the first alignment angle $\Phi 1$ and the second alignment angle $\Phi 2$ as they are closer to the center portion of the liquid crystal layer 300.

Although not shown in figures, the liquid crystal display 1000 may further include a backlight unit (not shown) disposed under the first substrate 100. The backlight unit includes a light source to provide the light to the liquid crystal layer 300.

In addition, although not shown in figures, the liquid crystal display 1000 may further include an overcoating layer (not shown) disposed between the pixel electrode 101 and the first alignment layer 110 and/or between the color filter 205 and the common electrode 207. The overcoating layer includes a transparent organic material and planarizes the first substrate 100 and the second substrate 200, respectively.

Further, although not shown in figures, the liquid crystal display 1000 may further include a pair of polarizing plates (not shown) facing each other while interposing the first and second substrates 100 and 200 therebetween. The polarizing plates have polarizing axes perpendicular to each other.

Figure 4A:
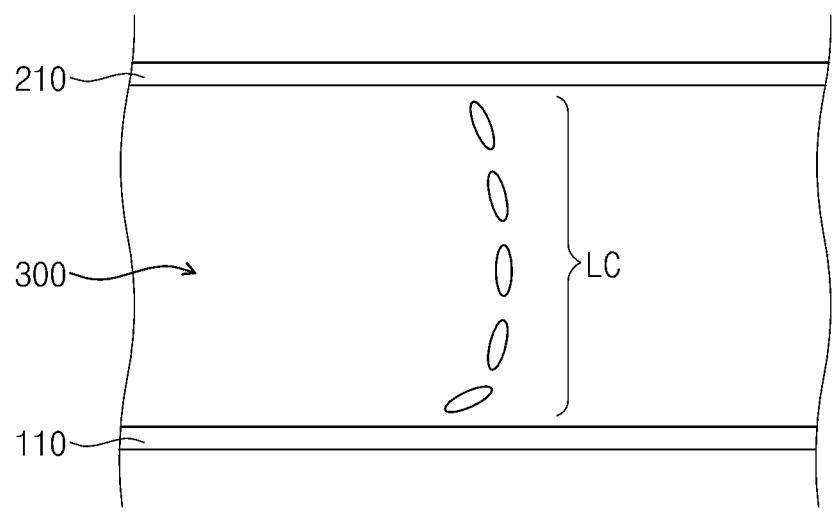
FIG. 4A is a view showing an exemplary embodiment of an arrangement of liquid crystal molecules when no electric field is applied thereto.
Figure 4B:
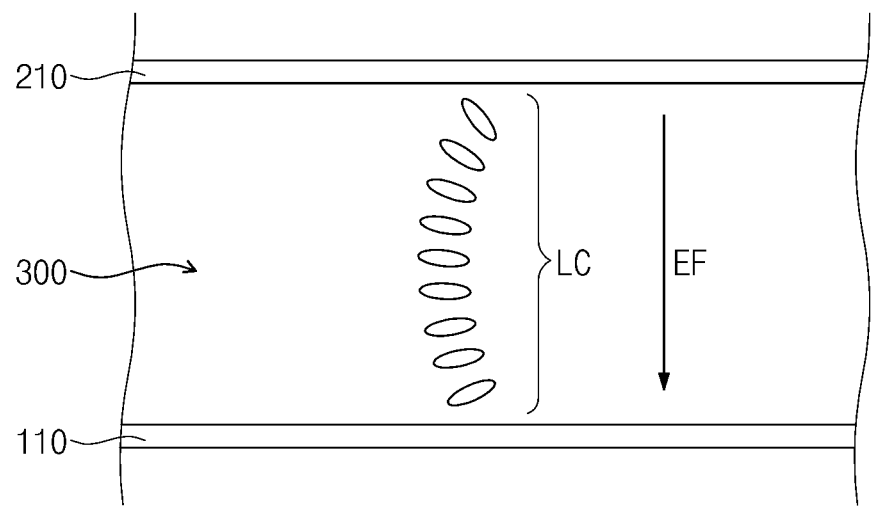
FIG. 4B is a view showing an exemplary embodiment of an arrangement of liquid crystal molecules when an electric field is applied thereto.

FIG. 4A is a view showing an exemplary embodiment of an arrangement of liquid crystal molecules when no electric field is applied thereto, and FIG. 4B is a view showing an exemplary embodiment of an arrangement of liquid crystal molecules when an electric field is applied thereto.

Referring to FIG. 4A, in the case that no electric field is applied to the liquid crystal layer 300, the liquid crystal molecules LC are arranged in a bended state. In this case, the liquid crystal display 1000 shown in FIG. 1 displays a black gray scale.

Referring to FIG. 4B, when the electric field EF is applied to the liquid crystal layer 300, the arrangement of the liquid crystal molecules LC is changed to a splay state from the bended state. FIG. 4B show the liquid crystal molecules LC arranged in the splay state. In this case, the liquid crystal display 1000 shown in FIG. 1 displays a white gray scale.

In a conventional liquid crystal display, the liquid crystal molecules are not pretilted or are pretilted at the same angle with respect to the first and second alignment layers. Accordingly, when the arrangement of the liquid crystal molecules in the conventional liquid crystal display is changed from the bended state to the splay state, a twist phenomenon occurs, in which the liquid crystal molecules in the center portion of the liquid crystal layer are rotated in a direction parallel to the first substrate without being arranged in the splay state regardless of the first and second liquid crystal molecules near a respectively alignment layer, and this twist phenomenon of the liquid crystal molecules is perceived by a viewer as defects. In addition, it may take a relatively long time such as one minute or more until the twisted liquid crystal molecules are arranged in the splay state.

According to one or more exemplary embodiment of the liquid crystal display according to the invention, the first liquid crystal molecules LC1 near the first alignment layer 110 have the pretilt angle different from that of the second liquid crystal molecules LC2 near the second alignment layer 210. Thus, when the arrangement of the liquid crystal molecules LC is changed from the bended state to the splay state, the liquid crystal molecules in the center portion of the liquid crystal layer 300 are arranged in the splay state along the pretilted first liquid crystal molecules LC1 or the pretilted second liquid crystal molecules LC2, which have the relatively small pretilt angle. As a result, the twist phenomenon of the liquid crystal molecules LC does not occur.

In addition, since the first liquid crystal molecules LC1 have different alignment angles from those of the second liquid crystal molecules LC2, the first and second liquid crystal molecules LC1 and LC2 have a uniform directivity even though the liquid crystal molecules LC in the center portion are twisted. Thus, the time required until the twisted liquid crystal molecules are completely arranged in the splay state may be reduced.

Figure 5A:
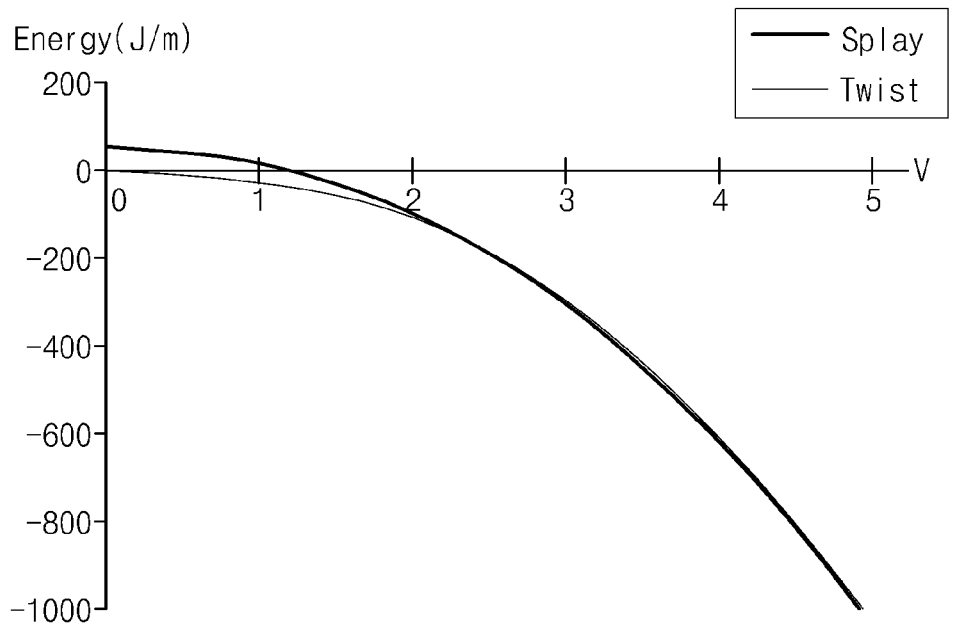
FIG. 5A is a graph showing an energy in joules per meter (J/m) of respective arrangements of liquid crystal molecules in accordance with application of a pixel voltage in volts (V) when first and second pretilt angles are different from each other.
Figure 5B:
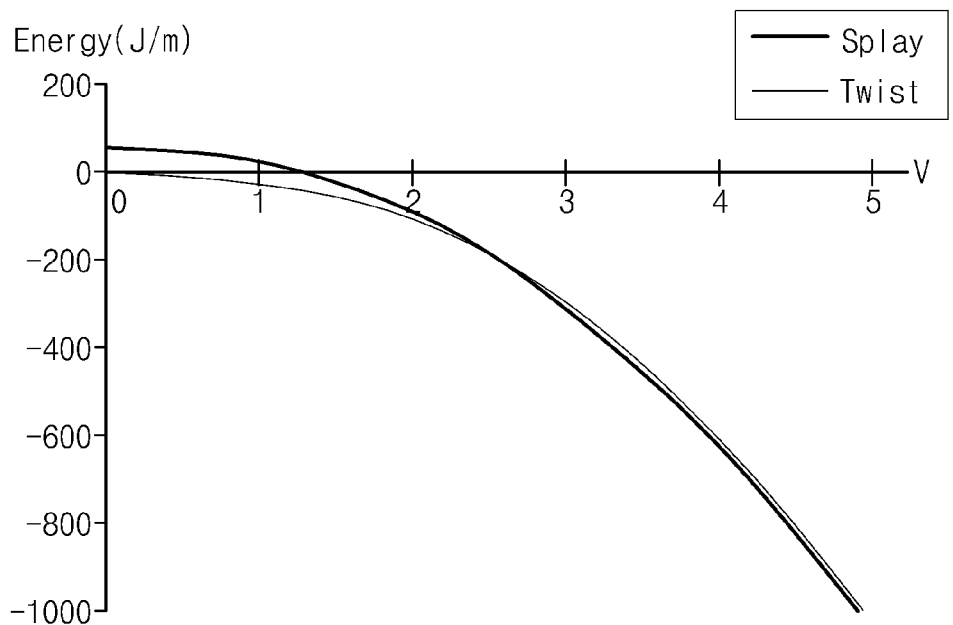
FIG. 5B is a graph showing the energy in J/m of respective arrangements of liquid crystal molecules in accordance with the application of the pixel voltage in V when first and second pretilt angles are the same.
Figure 6:
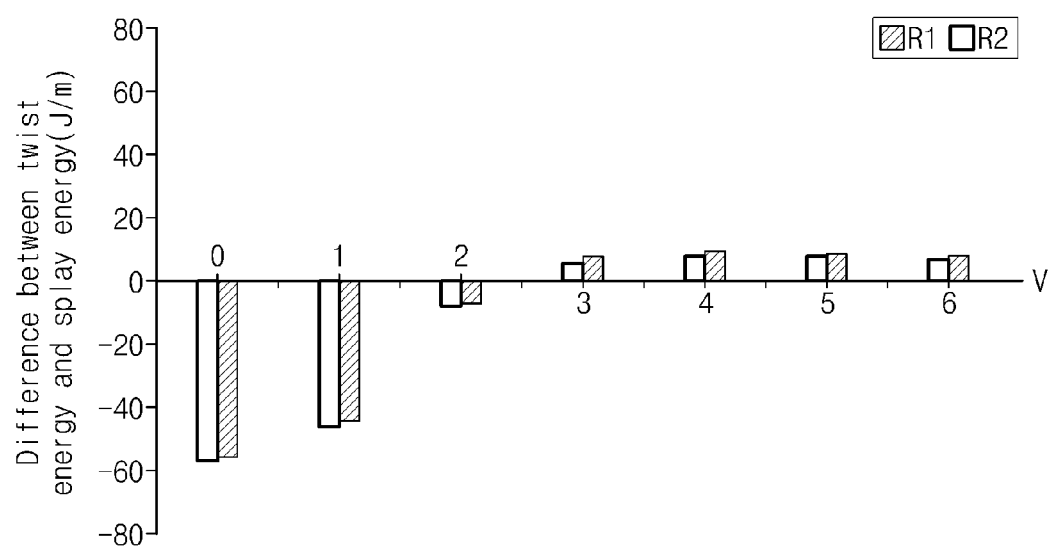
FIG. 6 is a graph showing an energy difference of respective arrangements of liquid crystal molecules in accordance with the application of the pixel voltage of FIGS. 5A and 5B.

FIG. 5A is a graph showing an energy in joules per meter (J/m) of respective arrangements of liquid crystal molecules in accordance with application of a pixel voltage in volts (V) when first and second pretilt angles are different from each other, and FIG. 5B is a graph showing the energy in J/m of respective arrangements of liquid crystal molecules in accordance with the application of the pixel voltage in V when first and second pretilt angles are the same. FIG. 6 is a graph showing an energy difference in J/m between respective arrangements of liquid crystal molecules in accordance with the application of the pixel voltage in V of FIGS. 5A (R1) and 5B (R2).

In FIG. 5A, the energy was measured on conditions that the first pretilt angle was about 85 degrees, the second pretilt angle was about 87 degrees, a cell gap between the first and second substrates (or alignment layers) was about 3 micrometers and the common voltage was zero volt. In FIG. 5B, the energy was measured on conditions that the first pretilt angle was about 87 degrees, the second pretilt angle was about 87 degrees, the cell gap was about 3 micrometers and the common voltage was zero volt.

Referring to FIGS. 5A, 5B, and 6, the difference between the twist energy and the splay energy in FIG. 5A (R1) was smaller than the difference between the twist energy and the splay energy in FIG. 5B when the pixel voltage is equal to or smaller than about 2.5 volts. Accordingly the energy (or force) required to change the arrangement of the liquid crystal molecules from the bended state to the splay state in FIG. 5A (R1) was smaller than the energy required to change the arrangement of the liquid crystal molecules from the bended state to the splay state in FIG. 5B (R2). Therefore, when first and second pretilt angles are different from each other, the twist phenomenon may be improved. In addition, since an energy level of the splay state is lower than an energy level of the twist state when the pixel voltage is equal to or greater than about 2.5 volts, the liquid crystal molecules may be arranged in the splay state without being twisted.

Figure 7:
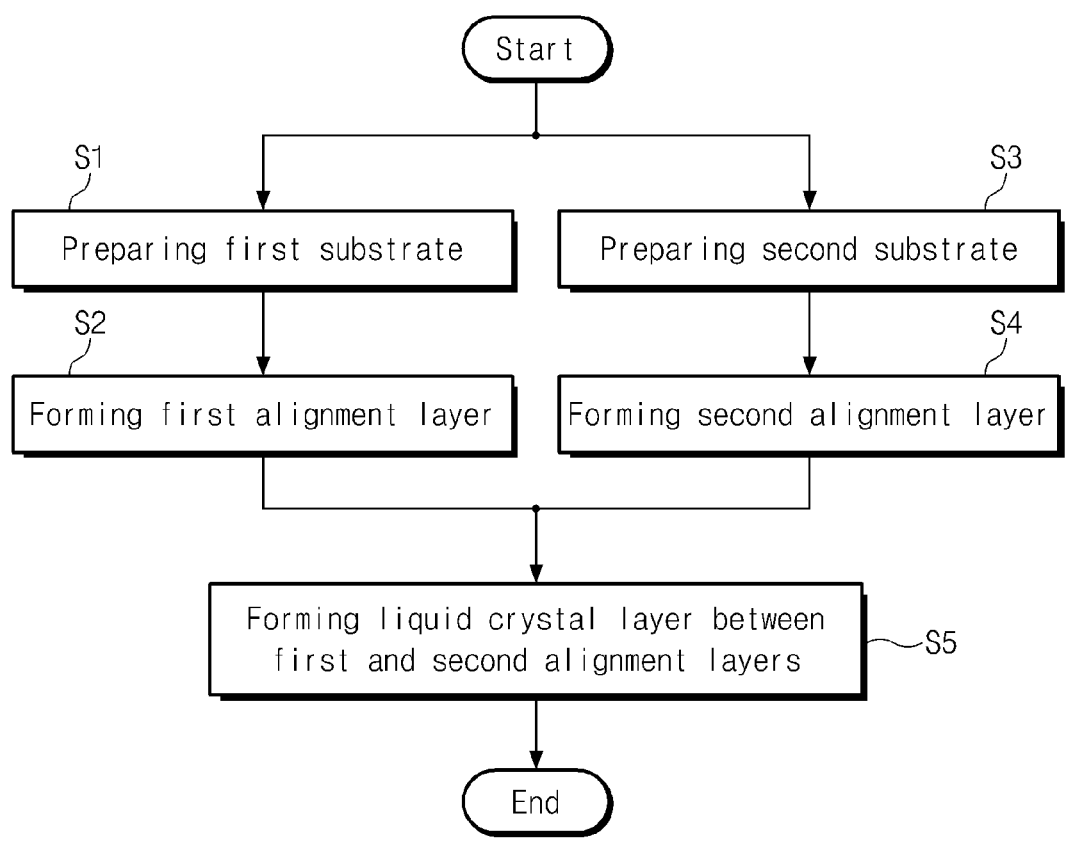
FIG. 7 is a flowchart showing an exemplary embodiment of a method of manufacturing a liquid crystal display according to the invention.
Figure 8:
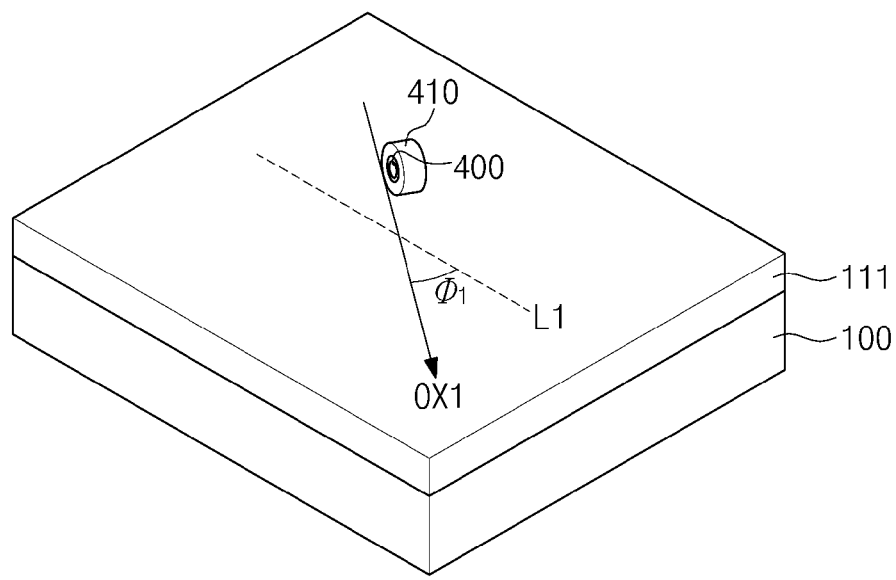
FIG. 8 is a perspective view showing an exemplary embodiment of a first rubbing process in a method of manufacturing a first alignment layer according to the invention.
Figure 9:
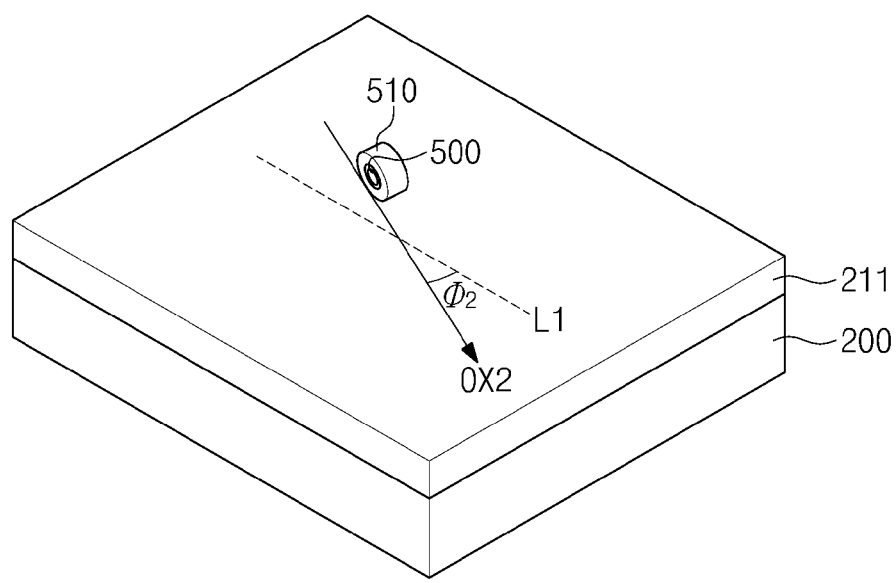
FIG. 9 is a perspective view showing an exemplary embodiment of a second rubbing process in a method of manufacturing a second alignment layer according to of the invention.

FIG. 7 is a flowchart showing an exemplary embodiment of a method of manufacturing a liquid crystal display according to an exemplary embodiment of the invention, FIG. 8 is a perspective view showing an exemplary embodiment of a first optical alignment process in a method of manufacturing a first alignment layer according to the invention, and FIG. 9 is a perspective view showing an exemplary embodiment of a second rubbing process in a method of manufacturing a second alignment layer according to the invention.

Referring to FIG. 7, the first substrate 100 including the thin film transistor and the pixel electrode is prepared (S1).

Referring to FIGS. 1, 2, and 8, the first alignment layer 110 is formed (e.g., provided) on the first substrate 100 (S2). The first alignment layer 110 is formed by coating a first alignment solution 111 on the first substrate 100 and performing a first rubbing process on the first alignment solution 111. The first alignment solution 111 may include a solvent.

The first alignment solution 111 may be, but is not limited to, a polymer material, e.g., polyimide. Then, the first alignment solution 111 is fired to remove so as to remove the solvent included in the first alignment solution 111.

The first rubbing process rubs the fired first alignment solution 111 in a direction of the first alignment axis OX1 under a first rubbing force. The first rubbing process is performed by rolling a first rubbing roll 400 wrapped with a rubbing cloth 410 at a relatively high speed, so that the first alignment layer 110 is formed. In this case, the first rubbing roll 400 travels in the direction along the first alignment axis OX1 while being rolled. The first alignment axis OX1 has the first alignment angle $\Phi 1$ with respect to the horizontal line L1 having the long axis extended in the direction substantially parallel to the first substrate 100. The direction of the long axis of the liquid crystal molecules LC (hereinafter, referred to as the first liquid crystal molecules LC1) on the surface of the first alignment layer 110 is determined along the first alignment axis OX1.

The first pretilt angle $\theta 1$ of the first liquid crystal molecules LC1 is decided by the first rubbing force. The first rubbing force is decided by controlling a nip width, a number of rubbing times, a rolling speed of the rubbing roll, a moving speed of a rubbing table mounted with the substrate, etc.

Referring to back FIG. 7, the second substrate 200 including the color filter and the common electrode is prepared (S3).

Referring to FIGS. 1, 2, and 9, the second alignment layer 210 is formed (e.g., provided) on the second substrate 200 (S4). The second alignment layer 210 is formed by coating a second alignment solution 211 on the second substrate 200 and performing a second rubbing process on the second alignment solution 211.

The second alignment solution 211 may include the same material as the first alignment solution 111, and may be fired to remove so as to remove the solvent included in the second alignment solution 211.

The second rubbing process rubs the fired second alignment solution 211 in a direction of the second alignment axis OX2 under a second rubbing force. The second rubbing process is performed by rolling a second rubbing roll 500 wrapped with a rubbing cloth 510 at a relatively high speed, so that the second alignment layer 210 is formed. In this case, the second rubbing roll 500 travels in the direction along the second alignment axis OX2 while being rolled. The second alignment axis OX2 has the second alignment angle $\Phi 2$ with respect to the horizontal line L1 having the long axis extended in the direction substantially parallel to the first substrate 100. The direction of the long axis of the liquid crystal molecules LC (hereinafter, referred to as second liquid crystal molecules LC2) on the surface of the second alignment layer 210 is determined along the second alignment axis OX2.

The difference between the first alignment axis OX1 and the second alignment axis OX2 is greater than zero degree and equal to or smaller than about five degrees. Thus, the first liquid crystal molecules LC1 and the second liquid crystal molecules LC2 define the difference greater than zero degree and equal to or smaller than about five degrees on the surface substantially parallel to the first substrate 100.

The second pretilt angle $\theta 2$ of the second liquid crystal molecules LC2 is decided by the second rubbing force. The second rubbing force is decided by controlling the nip width, the number of rubbing times, the rolling speed of the rubbing roll, the moving speed of the rubbing table mounted with the substrate, etc.

The first rubbing force and the second rubbing force are set to different values from each other. Since the first and second pretilt angles $\theta 1$ and $\theta 2$ are set by the first rubbing force and the second rubbing force, the first pretilt angle $\theta 1$ and the second pretilt angle $\theta 2$ are set to different values from each other, respectively. The first rubbing force and the second rubbing force may be set to allow a difference between the first pretilt angle $\theta 1$ and the second pretilt angle $\theta 2$ that is equal to or greater than about two degrees and equal to or smaller than about three degrees.

Then, the liquid crystal layer 300 is formed (e.g., provided) between the first alignment layer 110 and the second alignment layer 210 (S5). The liquid crystal layer 300 is formed by a dropping method or a vacuum injection method. In this case, the liquid crystal molecules LC in the liquid crystal layer 300 are initially aligned to respectively have the pretilt angles and the alignment angles on the surfaces of the first and second alignment layers 110 and 210, by the first and second alignment layers 110 and 210.

Hereinafter, another exemplary embodiment of a method of manufacturing a liquid crystal display according to the invention will be described.

The another exemplary embodiment of the method of manufacturing the liquid crystal display is substantially the same as previous exemplary embodiment of the method of manufacturing the liquid crystal display except for the process of forming the first and second alignment layers.

Figure 10:
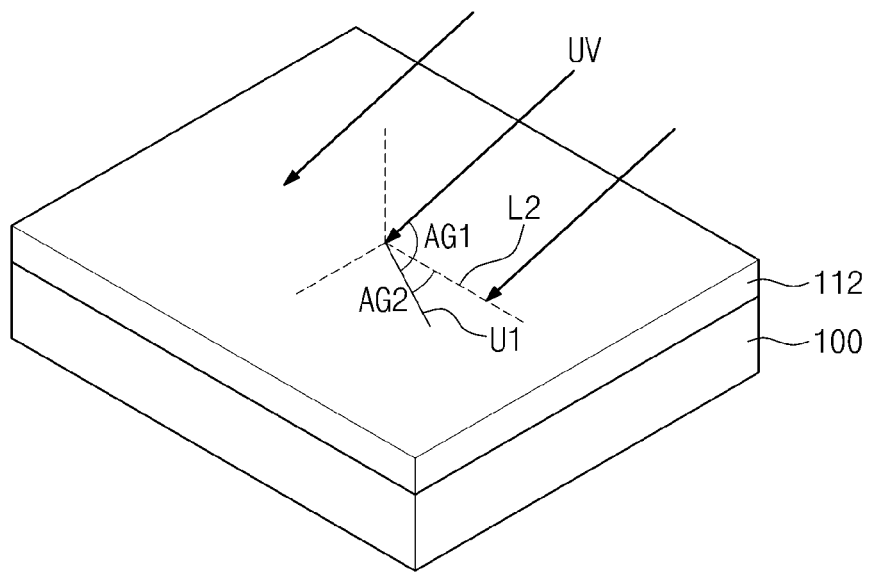
FIG. 10 is a perspective view showing an exemplary embodiment of a first optical alignment process in a method of manufacturing a first alignment layer according to the invention.
Figure 11:
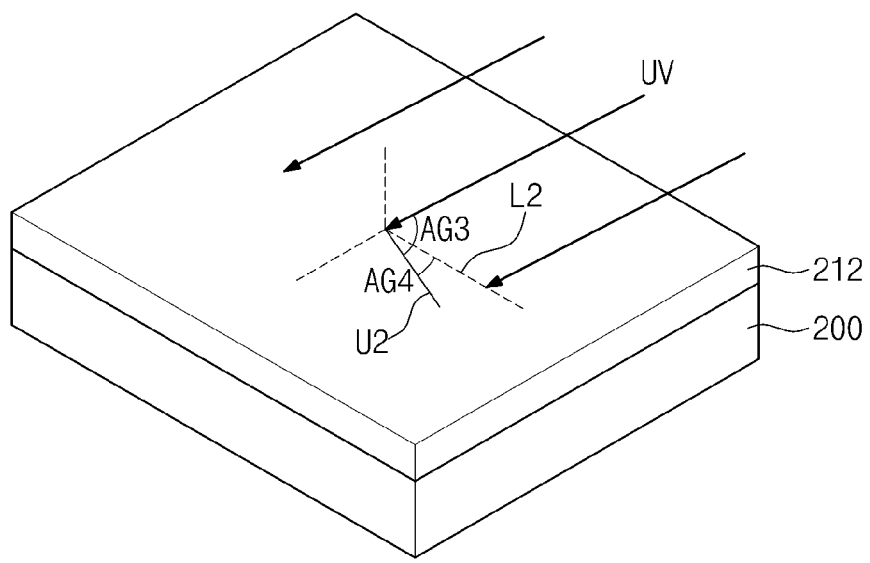
FIG. 11 is a perspective view showing an exemplary embodiment of a second optical alignment process in a method of manufacturing a second alignment layer according to the invention.

FIG. 10 is a perspective view showing an exemplary embodiment of a first optical alignment process in a method of manufacturing a first alignment layer according to the invention and FIG. 11 is a perspective view showing an exemplary embodiment of a second optical alignment process in a method of manufacturing a second alignment layer according to the invention.

Referring to FIG. 10, a first alignment solution 112 is coated on the first substrate 100. Then, the first alignment solution 112 is fired and an ultraviolet ray UV is irradiated onto the first alignment solution 112 in a first direction.

The first direction forms a first angle AG1 with respect to the plane surface parallel to the first substrate 100 along a direction vertical to the first substrate 100. In addition, a perpendicular line U1, which is obtained by projecting the first direction on the plane surface parallel to the first substrate 100, forms a second angle AG2 with respect to a reference line L2 having a long axis which extends parallel to the first substrate 100.

When the ultraviolet ray UV is irradiated onto the first alignment solution 112 along the first direction, the first alignment layer 110 is formed, and thus the first liquid crystal molecules LC1 have the pretilt angle, e.g., the first angle AG1, and the alignment angle, e.g., the second angle AG2 by the first alignment layer 110.

Referring to FIG. 11, a second alignment solution 212 is coated on the second substrate 200. Then, the second alignment solution 212 is fired and an ultraviolet ray UV is irradiated onto the second alignment solution 212 in a second direction, which may be different from the first direction.

The second direction forms a third angle AG3 with respect to the plane surface parallel to the second substrate 200 along a direction vertical to the second substrate 200. In addition, a perpendicular line U2, which is obtained by projecting the second direction on the plane surface parallel to the second substrate 200, forms a fourth angle AG4 with respect to the reference line L2 having the long axis parallel to the second substrate 200.

When the ultraviolet ray UV is irradiated onto the second alignment solution 212 along the second direction, the second alignment layer 210 is formed, and thus the second liquid crystal molecules LC2 have the pretilt angle, e.g., the third angle AG3, and the alignment angle, e.g., the fourth angle AG4 by the second alignment layer.

That is, the first and second directions form different angles with the horizontal plane surface of the first substrate 100, in the plane vertical (e.g., perpendicular) to the first substrate 100. The first and second directions form different angles with the horizontal line L2 having the long axis parallel to the first substrate 100, in the plane horizontal (e.g., parallel) to the first substrate 100.

Accordingly, the first angle AG1 and the third angle AG3 are different from each other and the second angle AG2 and the fourth angle AG4 are different from each other.

Hereinafter, still another exemplary embodiment of a method of manufacturing a liquid crystal display according to the invention will be described.

The still another exemplary embodiment of a method of manufacturing the liquid crystal display is substantially the same as the exemplary embodiments of a method of manufacturing the liquid crystal display except for the process of forming the liquid crystal layer.

Figure 12A:
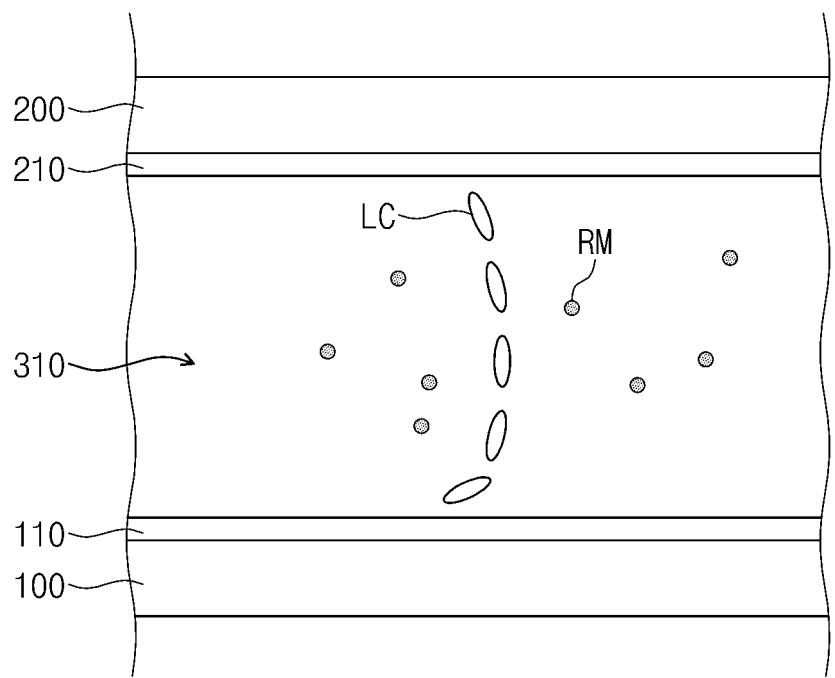
FIGS. 12A to 12C are views showing an exemplary embodiment of a process that cures a photopolymerization monomer to form a liquid crystal layer.
Figure 12B:
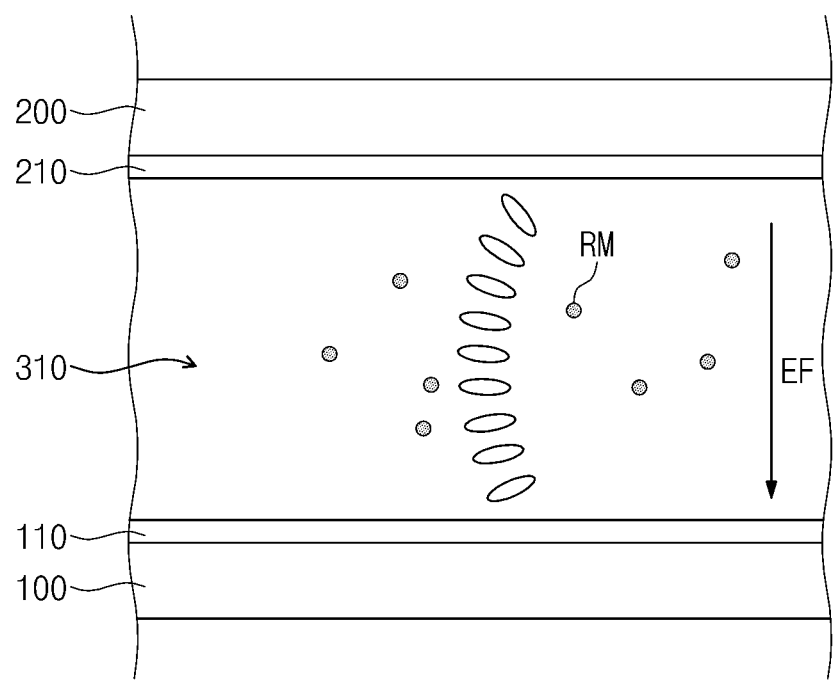
Figure 12C:
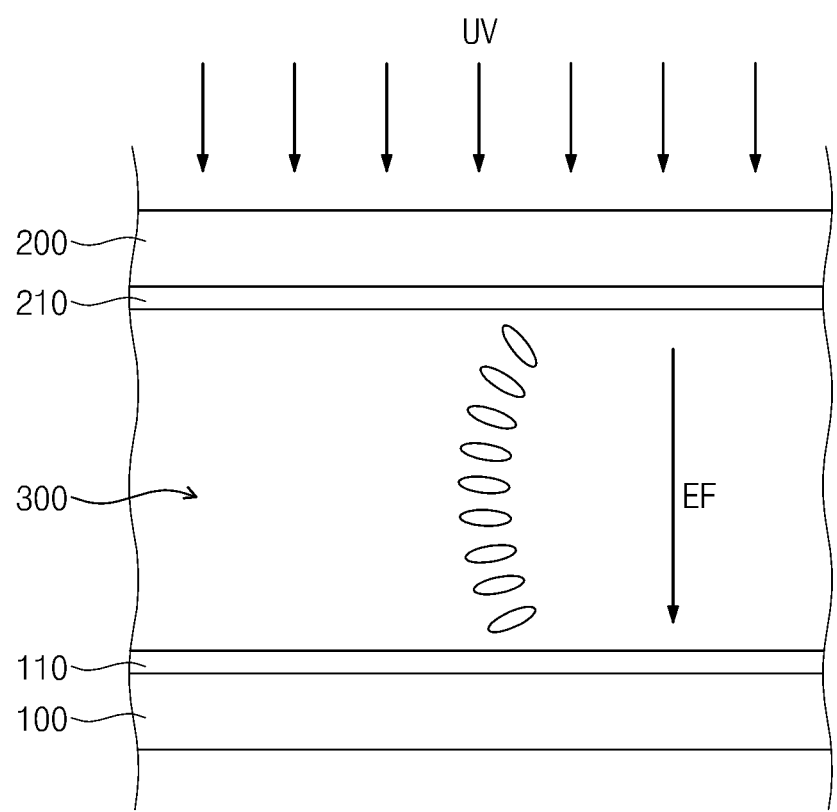

FIGS. 12A to 12C are views showing an exemplary embodiment of a process that cures a photopolymerization monomer to form a liquid crystal layer.

When the first substrate 100, the first alignment layer 110, the second substrate 200 and the second alignment layer 210 are formed, a liquid crystal composition layer 310 is formed (e.g., provided) between the first alignment layer 110 and the second alignment layer 210. The liquid crystal composition layer 310 includes the liquid crystal molecules LC and a photopolymerization monomer RM.

Referring to FIG. 12A, in the case that no electric field is applied to the liquid crystal composition layer 310, the liquid crystal molecules LC are arranged in the bended state by the first alignment layer 110 and the second alignment layer 210.

Then, referring to FIG. 12B, when the electric field EF is applied to the liquid crystal composition layer 310, the arrangement of the liquid crystal molecules LC is changed to the splay state from the bended state.

Referring to FIG. 12C, the photopolymerization monomer RM in the liquid crystal composition layer 310 is cured while the liquid crystal molecules LC are arranged in the splay state and the electric field EL is applied to the liquid crystal composition layer 310. In one exemplary embodiment, for example, the photopolymerization monomer RM may be cured by irradiating the ultraviolet ray UV onto the liquid crystal composition layer 310.

The photopolymerization monomer RM is cured to hold the liquid crystal molecules LC in the splay state, so that the liquid crystal layer 300 including the liquid crystal molecules LC pretilted in the splay state is formed.

As described above, when the process of curing the photopolymerization monomer RM is performed, the time required until the arrangement of the liquid crystal molecules LC is changed to the splay state from the bended state becomes shorter than the time required until the arrangement of the liquid crystal molecules LC is changed to the splay state from the bended state when the photopolymerization monomer is not cured.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A liquid crystal display comprising:
   a first substrate comprising a thin film transistor;
   a second substrate comprising a color filter and facing the first substrate;
   a first alignment layer on the first substrate;
   a second alignment layer on the second substrate and facing the first alignment layer;
   a first overcoating layer which is disposed between a pixel electrode and the first alignment layer, includes a transparent organic material and planarizes the first substrate
   a second overcoating layer which is disposed between the color filter and a common electrode, includes a transparent organic material and planarizes the second substrate; and
   a liquid crystal layer between the first alignment layer and the second alignment layer, and comprising liquid crystal molecules of which an arrangement is changed in accordance with an electric field applied thereto,
   wherein the liquid crystal molecules are arranged in a bended state when the electric field is not applied thereto and are arranged in a splay state when the electric field is applied thereto, and
   wherein the liquid crystal molecules on a surface of the first alignment layer have in the bended state;
      a first pretilt angle in a direction which is vertical with respect to a horizontal plane surface parallel to the first substrate, and
      a first alignment angle in a direction which is horizontal with respect to a horizontal line parallel to the horizontal plane surface, and
   wherein the liquid crystal molecules on a surface of the second alignment layer have in the bended state:
      a second pretilt angle in the direction which is vertical with respect to the horizontal plane surface, and different from the first pretilt angle, and
      a second alignment angle in the direction which is horizontal with respect to the horizontal line, and different from the first alignment angle.

2. The liquid crystal display of claim 1, wherein a difference between the first pretilt angle and the second pretilt angle is in a range equal to or greater than about two degrees and equal to or smaller than about three degrees.

3. The liquid crystal display of claim 2, wherein a difference between the first alignment angle and the second alignment angle is in a range equal to or greater than about zero degrees and equal to or smaller than about five degrees.

4. The liquid crystal display of claim 1, wherein
   the first alignment layer has a first alignment axis, and the first alignment angle is defined between the first alignment axis and the horizontal line,
   the second alignment layer has a second alignment axis, and the second alignment angle is defined between the second alignment axis and the horizontal line, and
   the first alignment axis is different from the second alignment axis.

5. A method of manufacturing a liquid crystal display, the method comprising:
   preparing a first substrate comprising a thin film transistor;
   preparing a second substrate comprising a color filter;
   providing a first alignment layer on the first substrate;
   providing a second alignment layer on the second substrate;
   providing a first overcoating layer which is disposed between a pixel electrode and the first alignment layer, includes a transparent organic material and planarizes the first substrate;
   providing a second overcoating layer which is disposed between the color filter and a common electrode, includes a transparent organic material and planarizes the second substrate; and
   providing a liquid crystal layer comprising liquid crystal molecules, between the first substrate and the second substrate,
   wherein the liquid crystal molecules are arranged in a bended state when the electric field is not applied thereto and are arranged in a splay state when the electric field is applied thereto, and
   wherein the liquid crystal molecules on a surface of the first alignment layer have in the bended state:
      a first pretilt angle in a direction which is vertical with respect to a horizontal plane surface parallel to the first substrate, and
      a first alignment angle in a direction which is horizontal with respect to a horizontal line parallel to the horizontal plane surface, and
   wherein the liquid crystal molecules on a surface of the second alignment layer have in the bended state:
      a second pretilt angle in the direction which is vertical with respect to the horizontal plane surface, and different from the first pretilt angle, and
      a second alignment angle in the direction which is horizontal with respect to the horizontal line, and different from the first alignment angle.

6. The method of claim 5, wherein a difference between the first pretilt angle and the second pretilt angle is in a range equal to or greater than about two degrees and equal to or smaller than about three degrees.

7. The method of claim 6, wherein a difference between the first alignment angle and the second alignment angle is in a range equal to or greater than about zero degrees and equal to or smaller than about five degrees.

8. The method of claim 5, wherein each of the providing a first alignment layer and the providing a second alignment layer comprises a rubbing process or an optical alignment process.

9. The method of claim 5, wherein
the first alignment layer has a first alignment axis, and the first alignment angle is defined between the first alignment axis and the horizontal line,
the second alignment layer has a second alignment axis, and the second alignment angle is defined between the second alignment axis and the horizontal line, and
the first alignment axis is different from the second alignment axis.

10. The method of claim 9, wherein the providing a first alignment layer comprises:
coating a first alignment solution on the first substrate; and
rubbing the first alignment solution in a direction of the first alignment axis, under a first rubbing force.

11. The method of claim 10, wherein the providing a second alignment layer comprises:
coating a second alignment solution on the second substrate; and
rubbing the second alignment solution in a direction of the second alignment axis, under a second rubbing force which is different from the first rubbing force.

12. The method of claim 5, wherein the providing a first alignment layer comprises:
coating a first alignment solution on the first substrate; and
irradiating an ultraviolet ray onto the first alignment solution and in a first direction.

13. The method of claim 12, wherein the providing a second alignment layer comprises:
coating a second alignment solution on the second substrate; and
irradiating the ultraviolet ray onto the second alignment solution and in a second direction which is different from the first direction.

14. The method of claim 13, wherein the first direction and the second direction form
different angles from each other in the direction which is vertical with respect to the horizontal plane surface parallel to the first substrate, and
different angles from each other in the direction which is horizontal with respect to the horizontal line.

15. The method of claim 5, wherein the providing a liquid crystal layer comprises:
providing a liquid crystal composition layer comprising a photopolymerization monomer, between the first alignment layer and the second alignment layer;
applying an electric field to the liquid crystal composition layer to arrange the liquid crystal molecules in a splay state; and
curing the photopolymerization monomer while the liquid crystal molecules are in the splay state and the electric field is applied to the liquid crystal composition layer.

* * * * *